United States Patent
Zeng et al.

(10) Patent No.: US 7,631,232 B2
(45) Date of Patent: Dec. 8, 2009

(54) PARALLEL BURNING SYSTEM AND METHOD

(75) Inventors: Wei-Xin Zeng, Tianjin (CN); Xiao Jiang, Tianjin (CN); Jeff Song, Taipei (TW); Jhih-Ren Jin, Taipei (TW); Tom Chen, Taipei (TW); Win-Harn Liu, Taipei (TW)

(73) Assignee: Inventec Corporation, Taipei (TW)

( * ) Notice: Subject to any disclaimer, the term of this patent is extended or adjusted under 35 U.S.C. 154(b) by 234 days.

(21) Appl. No.: 11/905,291

(22) Filed: Sep. 28, 2007

(65) Prior Publication Data

US 2009/0089469 A1 Apr. 2, 2009

(51) Int. Cl.
*G11C 29/00* (2006.01)
(52) U.S. Cl. ...................................... 714/718
(58) Field of Classification Search .................. 714/718, 714/799; 702/58, 64, 108, 117, 118, 183, 702/186; 324/765; 365/200, 201
See application file for complete search history.

(56) References Cited

U.S. PATENT DOCUMENTS

| | | | |
|---|---|---|---|
| 5,539,692 A * | 7/1996 | Kajigaya et al. ............ | 365/201 |
| 6,675,360 B1 * | 1/2004 | Cantone et al. ................ | 716/1 |
| 2007/0171150 A1 * | 7/2007 | Zhang et al. .................. | 345/60 |
| 2008/0086625 A1 * | 4/2008 | Chiu .......................... | 712/220 |
| 2009/0085605 A1 * | 4/2009 | Zheng et al. .................. | 326/37 |

* cited by examiner

*Primary Examiner*—Phung M Chung
(74) *Attorney, Agent, or Firm*—Muncy, Geissler, Olds & Lowe, PLLC

(57) ABSTRACT

A parallel burning system and method is for burning chips of various different bus types in parallel. A computer compiles configuration information according to corresponding connection relations between the chips and the micro controller units, and transmits the configuration information, burning command and burning data to a master micro controller unit of the micro controller units. The master micro controller unit distributes the burning data to slave micro controller units of the micro controller units based on the analyzed configuration information, and controls each slave micro controller unit to activate its burning operation. Then, the slave micro controller units burn the burning data onto the chips connected thereto, and transmit the burning results back to the master micro controller unit after completion of the burning operations. Finally, the master micro controller unit transmits the burning results back to the computer after completion of all the burning operations.

6 Claims, 3 Drawing Sheets

PARALLEL BURNING SYSTEM AND METHOD

BACKGROUND

1. Field of Invention

The invention relates to a chip burn system and method, and in particular, to a parallel burning system and method capable of burning various types of chips in parallel at the same time.

2. Related Art

Presently, most of burning machines available on a market are only capable of burning chip in serial. Even though there are a few burning machines that are capable of burning the chips in parallel, yet this can only be done to a few chips of the same bus type at the same time.

By way of example, a well known chip burning method of prior art is to proceed as following. Firstly, a burning file is loaded into a master server. Next, the master server transmits the burning file to a burning card through a parallel interface, and then the burning card converts the received burning file into serial data. Finally, the burning card loads the converted burning file onto a chip to be burned through a serial interface. Thus, in this manner, a one-to-one serial burning of file to the chip is realized, namely, a controller may achieve the burning of only a chip in a specific time interval. In this burning method, one controller only realizes the serial burning of one type of chip at one time. Thus, if a parallel burning is required, then a plurality of controllers must be used, hereby achieving the burning operation in a superimposed equivalent manner, thus realizing the parallel burning of several chips at the same time. However, this type of approach is applicable and effective only to the parallel burning for the chips of the same type.

In the prior art, there exists still another method of one-to-many serial burning for the same type of chips, namely, a controller is used to burn a plurality of chips of the same bus type one-by-one in a specific time interval through switching an electronic switch; as such, the characteristics of the bus is utilized to achieve one-to-many chips burning through switching the switch in time when the bus is waiting. In this way of chip burning, a controller may be used to realize serial burning for the chips of the same type in a specific time interval. However, it can not be utilized to achieve parallel burning for the chips of different types.

For the above reasons, the research and development of a system and method, that is capable of burning different bus types of chips in parallel, is probably one of the most urgent tasks in this field.

SUMMARY OF THE INVENTION

In view of the above-mentioned drawbacks and shortcomings of the prior art, the objective of the invention is to provide a parallel burning system and method, that is capable of burning chips of different bus types in parallel at the same time.

The invention provides a parallel burning system, including a computer and micro controller units. The micro controller units (MCU) have a master micro controller unit and slave micro controller units. The master micro controller unit and the slave micro controller units is used to be connected to the chips of various designated bus types to be burned.

The computer can compile configuration information according to corresponding connection relations between the chips and the micro controller units, and transmit the configuration information, burning command, burning data to the master micro controller unit. The master micro controller unit can analyze the received configuration information, distribute the burning data to the slave micro controller units based on the analyzed configuration information, and control each slave micro controller unit in activating its burning operation. Then, the slave micro controller units can execute the burning operations to burn the burning data onto the chips of the designated bus types connected thereto, and transmit the burning results relative to the burning operations back to the master micro controller unit upon completion of the burning operations. Finally, the master micro controller unit can transmit the burning results to the computer upon completion of all burning operations.

In the above description, the master micro controller unit may also execute its burning operation for the chip connected thereto according to the configuration information and collect all burning results.

The configuration information can include the following items: identification code of the chip to be burned, bus type, capacity, required voltage value for burning, serial number and corresponding port number of the connected micro controller unit, and contents and length of the burning data.

The invention provides a parallel burning method, for burning chips of different bus types in parallel by making use of a computer and a plurality of micro controller units, including the following steps.

The chips to be burned of designated bus types are connected to the micro controller units, respectively. One of the micro controller units is selected as a master micro controller unit, and the other of the micro controller units designate[s] as the slave micro controller unit[s]. The system compiles configuration information according to the corresponding connection relations of the chips and the micro controller units. The configuration information, burning command, and burning data are transmitted to the master micro controller unit. The master micro controller analyzes the received configuration information, and then distributes the burning data to the slave micro controller units according to the configuration information. Each of the slave micro controller units is controlled in activating its burning operation. Then, the slave micro controller units execute the burning operations to burn the burning data onto the chips connected thereto, and transmit the burning results relative to the burning operations back to the master micro controller unit upon completion of the burning operations. Finally, that, if all the burning operations finish, is determined. If all burning operations finish, the master micro controller unit transmits all burning results back to the computer. Otherwise, the burning operations proceeds until all burning operations finish.

In one embodiment, the parallel burning method further includes the following steps. The master micro controller unit executes its burning operations for the chips connected thereto according to the configuration information, and collects the burning results for the chips.

Furthermore, the configuration information can include the following items: identification code of the chip to be burned, bus type, capacity, required voltage value for burning, serial number and corresponding port number of the connected micro controller unit, and contents and length of the burning data.

The invention provides a parallel burning system and method, wherein, several micro controller units are coordinated to operate in cooperation, and burning information is pre-disposed by a computer, thus avoiding conflicts in the parallel burning of different types of chips, hereby realizing the parallel burning of the chips of different bus types at the same time, and raising the chip burning efficiency and the scope of its application significantly.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given herein below for illustration only, and thus are not limitative of the present invention, and wherein.

DETAILED DESCRIPTION OF THE INVENTION

The purpose, construction, features, and functions of the invention can be appreciated and understood more thoroughly through the following detailed description with reference to the attached drawings.

In the following, the preferred embodiments of the invention will be described in detail together with the attaching drawings.

Figure 1:
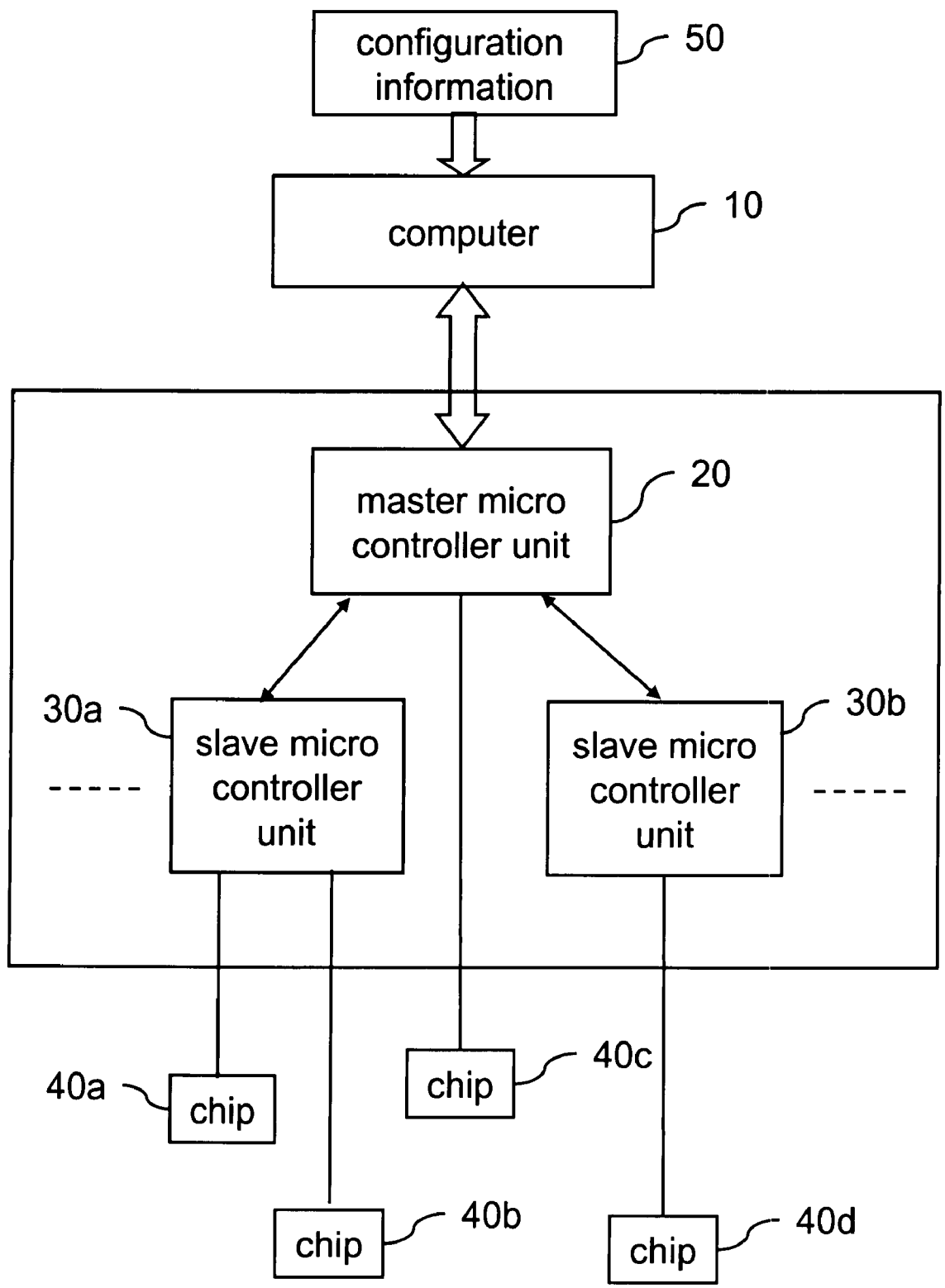
FIG. 1 is a system block diagram of a parallel burning system according to an embodiment of the invention.

Firstly, refer to FIG. 1 for a system block diagram of a parallel burning system according to an embodiment of the invention. As shown in FIG. 1, the parallel burning system of the invention is used to burn chips of different bus types. A computer 10 compiles the corresponding connection relations between the chips 40a, 40b, 40c, and 40d to be burned, and micro controller units, i.e. a master micro controller unit 20 and the slave micro controller units 30a, and 30b, into configuration information 50 through a configuration tool, and transmits the compiled configuration information 50, a burning command, and burning data to the master micro controller unit 20 through a blasting program in the computer 10. Next, the master micro controller unit 20 analyzes the configuration information for sorting and collating the entire configuration information, and transmits the burning command and burning data to the slave micro controller units 30a and 30b (delegates only one burning task to a slave micro controller unit at a time, and will delegate the next burning task when this burning task is finished) according to the configuration information, and controls each of the slave micro controller units 30a and 30b in activating its burning operation. By way of example, upon analyzing the configuration information, the master micro controller unit 20 will fetch a first item of the configuration information (such as, the information of burning chip 40a) from the configuration queue of the slave micro controller unit 30a, and transmit it to the slave micro controller unit 30a. And the master micro controller unit 20 will fetch a first item of the configuration information (such as, the information of burning chip 40d) from the configuration queue of the slave micro controller unit 30b, and transmit it to the slave micro controller unit 30b. Subsequently, the master micro controller unit 20 provides the power respectively to the burning chips 40a and 40d according to their required voltage values, and transmits the burning command respectively to the slave micro controller units 30a and 30b to activate their burning operations simultaneously. The slave micro controller units 30a and 30b execute the burning operations respectively to burn the burning data simultaneously onto the chips 40a and 40d of designated bus types connected thereto, and then transmit the burning results relative to the burning operations back to the master micro controller unit 20 upon the completion of the burning operations. The master micro controller unit 20 will wait for the burning results transmitted back from the slave micro controller units 30a and 30b, and upon receiving the burning results transmitted back from the slave micro controller unit 30a, the master micro controller unit 20 will fetch a second item of the configuration information (such as, the information of burning chip 40b) from the configuration queue of the slave micro controller unit 30a, and transmit it to the slave micro controller unit 30a to proceed with the subsequent burning operations. Meanwhile, the master micro controller unit 20 may also execute it burning operation for the chips 40c to be burned that are connected thereto according to the configuration information and collect the burning results. When all the items of the configuration information in the configuration queues of all the micro controller units (including the master and slave micro controller units) have finished processing, namely, when all the burning operations have finished, the master micro controller unit 20 will transmit all received burning results and collected back to the computer 10.

Figure 2:
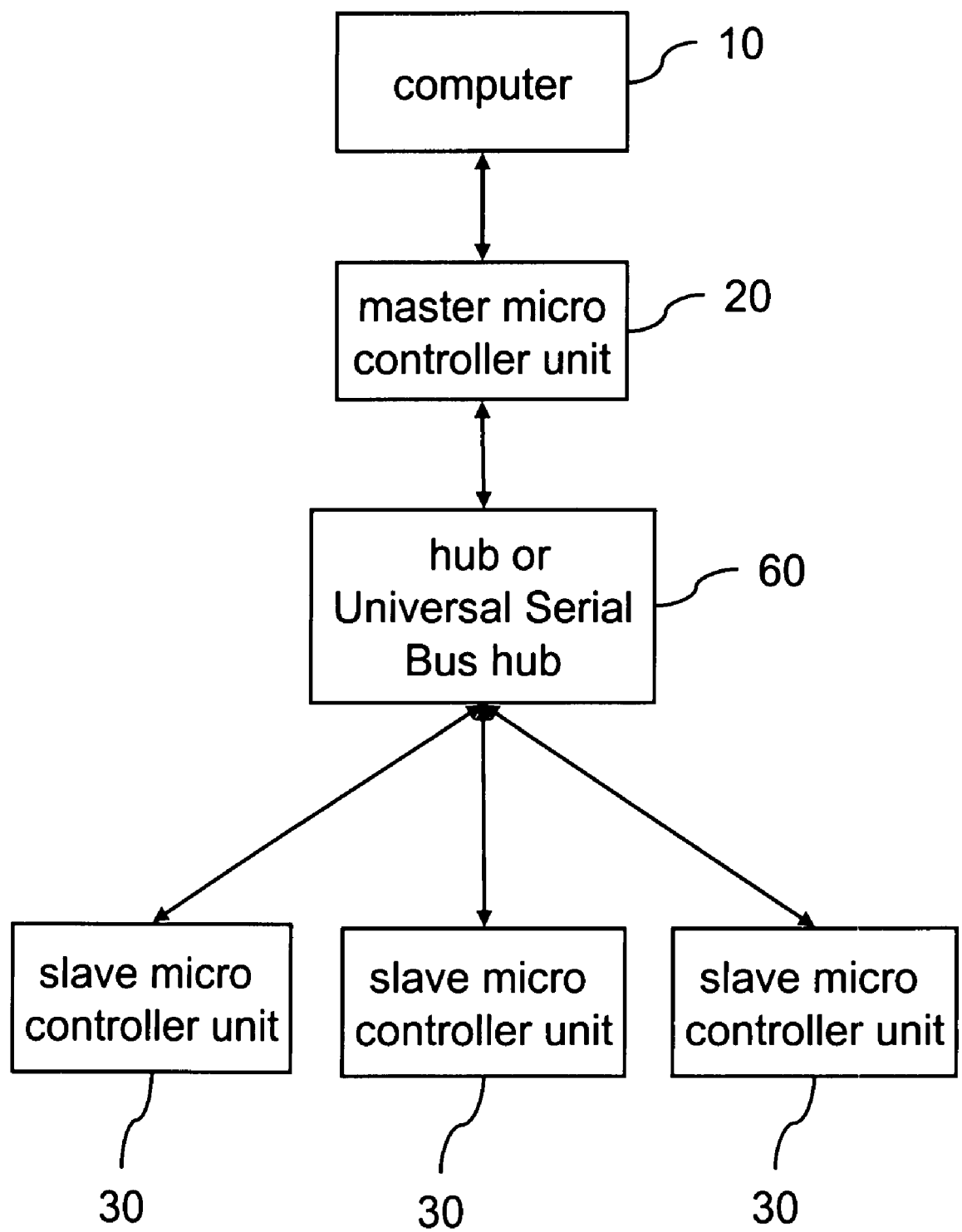
FIG. 2 is a schematic diagram indicating the connection relations of a computer, a master micro controller unit, and the slave micro controller units of the parallel burning system according to an embodiment of the invention.

Refer to FIG. 2 for a schematic diagram indicating the connection relations of the computer 10, the master micro controller unit 20, and the slave micro controller units 30 of the parallel burning system according to an embodiment of the invention. As shown in FIG. 2, the parallel burning system of the invention includes a computer 10, a master micro controller unit 20, and slave micro controller units 30. The master micro controller unit 20 may communicate with the slave micro controller units 30 through a Hub or a Universal Serial Bus Hub (USB Hub) 60. The master micro controller unit 20 may also communicate with the computer 10. However, the slave micro controller unit 30 may only communicate with the master micro controller unit 20 through a Hub or a Universal Serial Bus Hub (USB Hub) 60. In this configuration, the master micro controller unit 20 may transmit the configuration information, the burning data, and the burning command to the slave micro controller units 30; while the slave micro controller units 30 may transmit the burning results for the chips connected thereto back to the master micro controller unit 20. In addition, the master micro controller unit 20 is also responsible for the burning of the chip connected thereto, and controlling and managing the power-on and power-off of all chips to be burned.

Figure 3:
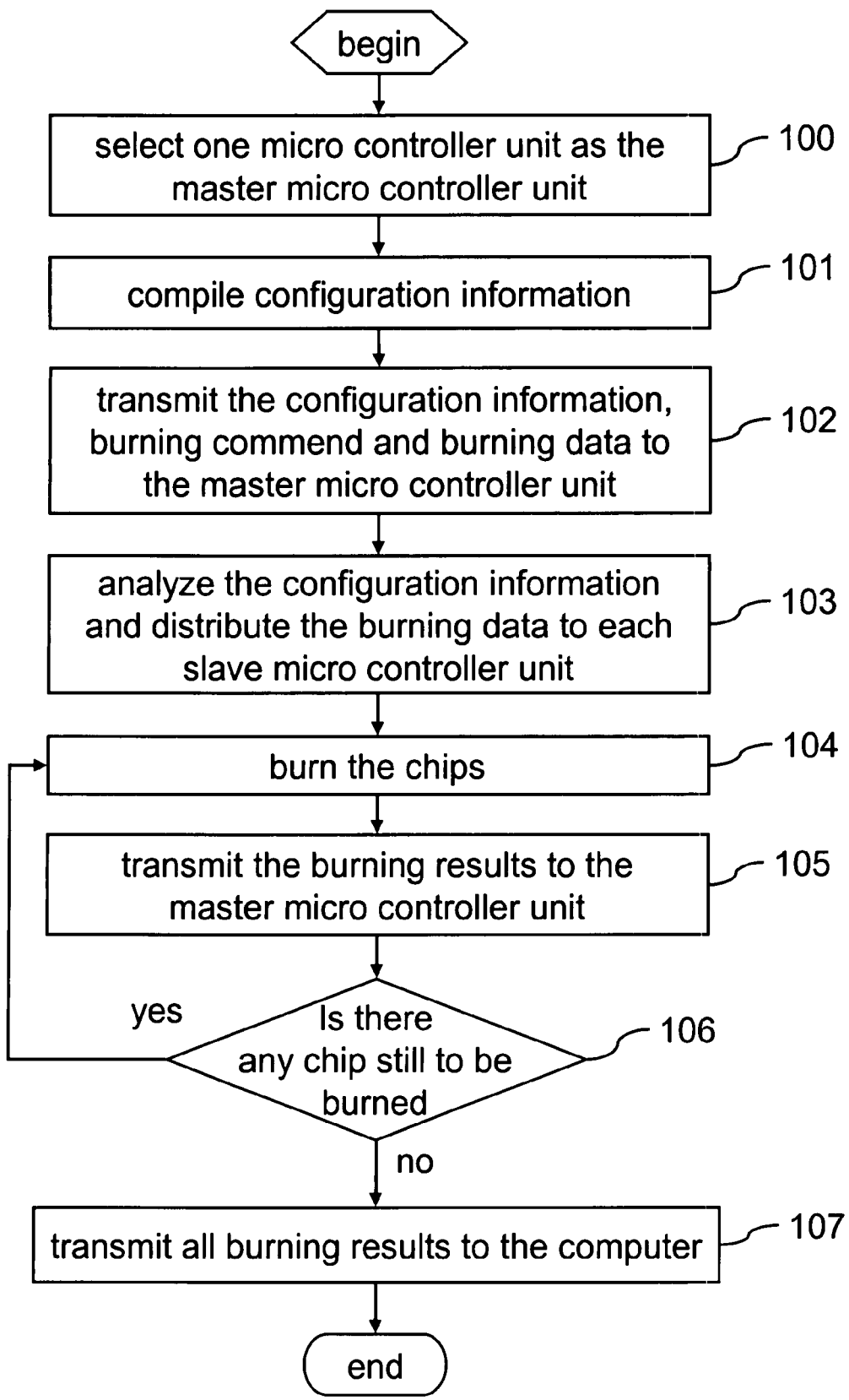
FIG. 3 is a flowchart of the steps of the parallel burning method according to an embodiment of the invention.

Refer to FIG. 3 for a flowchart of the steps of the parallel burning method according to an embodiment of the invention for a clearer description of the burning method provided by the invention. As shown in FIG. 3, the parallel burning method according to the invention includes the following steps.

Firstly, chips of designated bus types to be burned are connected to micro controller units, respectively (this step not shown). One of the micro controller units is selected as a master micro controller unit, and the rest of micro controller units is [are] designated as slave micro controller units (step 100). A system compiles configuration information according to corresponding connection relations between the chips to be burned and the micro controller units (step 101). In this step 101, the corresponding connection relations between the chips to be burned and the micro controller units may be compiled into the configuration information utilizing an ordinary configuration tool. Subsequently, the system transmits the configuration information, burning command, and burning data to the master micro controller unit through a blasting program (step 102). The master micro controller unit analyzes the configuration information and thus sorts and collates the entire configuration information, to distribute the burning command and the burning data to each of the slave micro controller units according to the analyzed configuration information, and then to control each of the slave micro controller units in activating its burning operation (step 103). The slave micro controller units execute the burning operations, hereby burning the burning data onto the chips connected thereto (step 104). Then, the slave micro controller units transmit the burning results relative to the burning operations back to the master micro controller unit upon completion of the burning operations (step 105). Finally, it is determined if all burning operations finish, namely, if there are chips still to be burned (step 106). If the answer is affirmative, i.e. all burning operations finish, the master micro controller unit transmits all burning results back to the computer (step 107); otherwise, the process goes back to the step 104, the burning operations proceed to be executed until all burning operations finish.

Furthermore, in the parallel burning method of the invention, the master micro controller unit may also execute the burning operation for the chips to be burned that are connected thereto according to the configuration information, and collect all burning results.

In addition, the configuration information utilized in the implementing the parallel burning system and method according to the invention includes the following items: identification code of the chip to be burned, bus type, capacity, required voltage value for burning, serial number and corresponding port number of the connected micro controller unit, and contents and length of the burning data. Wherein, the bus type for the chip to be burned can be one of the followings various types of buses: Inter Integrated Circuit (IIC) type, Serial Peripheral Interface (SPI) type, Programmable System Of Chip (PSOC) type, Priority Interrupt Control (PIC) type, Complex Programmable Logic Device (CPLD) type, and Basic Input Output System (BIOS) type, etc.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A parallel burning system, for burning a plurality of chips of various different bus types, comprising:
    a computer; and
    a plurality of micro controller units, for being connected to the chips to be burned, the micro controller units comprising: a master micro controller unit and a plurality of slave micro controller units;
    wherein the computer is used for compiling a configuration information according to corresponding connection relations between the chips and the micro controller units, and for transmitting the configuration information, a burning command and burning data to the master micro controller unit;
    wherein the slave micro controller units is used for executing a plurality of burning operations to burn the burning data onto the chips connected thereto, and for transmitting a plurality of burning results relative to the burning operations back to the master micro controller unit after completion of the burning operations; and
    wherein the master micro controller unit is used for analyzing the configuration information to distribute the burning data to the slave micro controller units according to the configuration information, for controlling each of the slave micro controller units to activate its burning operation, and for transmitting all burning results relative to the burning operations back to the computer after completion of all the burning operations.

2. The parallel burning system as claimed in claim 1, wherein the master micro controller unit is used for executing its burning operation to burn the chip connected thereto according to the configuration information, and for collecting the burning results.

3. The parallel burning system as claimed in claim 1, wherein the configuration information comprises: a plurality of identification codes of the chips, a plurality of bus types, a plurality of capacity, a plurality of voltage values for burning, a plurality of serial numbers and a plurality of corresponding port numbers of the connected micro controller units, and a plurality of contents and a plurality of length of the burning data.

4. A parallel burning method, for parallel burning a plurality of chips of various different bus types utilizing a computer and a plurality of micro controller units, comprising:
    connecting the chips to be burned with the micro controller units respectively;
    selecting one of the micro controller units as a master micro controller unit, the rest of the micro controller units as the slave micro controller units;
    compiling a configuration information according to corresponding connection relations between the chips and the connected micro controller units by the computer;
    transmitting the configuration information, a burning command, and burning data to the master micro controller unit;
    upon analyzing said configuration information by the master micro controller unit, distributing the burning data to the slave micro controller units according to the configuration information;
    controlling each of the slave micro controller units to activate its burning operation;
    executing a plurality of burning operations by the slave micro controller units to burn the burning data onto the chips connected thereto;
    transmitting a plurality of burning results relative to the burning operations back to the master micro controller unit upon completion of the burning operations; and
    determining all the burning operations finish; and
    transmitting all the burning results back to the computer by the master micro controller unit when all the burning operations finish.

5. The parallel burning method as claimed in claim 4, further comprising:
    executing its burning operation for the chip connected thereto by the master micro controller unit according to the configuration information; and
    collecting the burning results for the chips by the master micro controller.

6. The parallel burning method as claimed in claim 4, wherein said configuration information comprises: a plurality of identification codes of the chips, a plurality of bus types, a plurality of capacity, a plurality of voltage values for burning, a plurality of serial numbers and a plurality of corresponding port numbers of the connected micro controller units, and a plurality of contents and a plurality of length of the burning data.

* * * * *